(12) United States Patent
Boukaftane et al.

(10) Patent No.: US 10,108,087 B2
(45) Date of Patent: *Oct. 23, 2018

(54) METHOD OF IMPROVING LIGHT STABILITY OF FLEXOGRAPHIC PRINTING PLATES FEATURING FLAT TOP DOTS

(71) Applicant: MacDermid Graphics Solutions, LLC, Waterbury, CT (US)

(72) Inventors: Chouaib Boukaftane, Decatur, GA (US); Jonghan Choi, Marietta, GA (US)

(73) Assignee: MacDermid Graphics Solutions LLC, Waterbury, CT (US)

( * ) Notice: Subject to any disclaimer, the term of this patent is extended or adjusted under 35 U.S.C. 154(b) by 53 days.

This patent is subject to a terminal disclaimer.

(21) Appl. No.: 15/067,622

(22) Filed: Mar. 11, 2016

(65) Prior Publication Data

US 2017/0259607 A1   Sep. 14, 2017

(51) Int. Cl.
*G03F 7/20* (2006.01)
*G03F 7/004* (2006.01)

(52) U.S. Cl.
CPC ......... *G03F 7/004* (2013.01); *B41M 2205/14* (2013.01)

(58) Field of Classification Search
CPC ....................................................... G03F 7/20
See application file for complete search history.

(56) References Cited

U.S. PATENT DOCUMENTS

| | | |
|---|---|---|
| 3,265,765 A | 8/1966 | Holden et al. |
| 3,867,153 A | 2/1975 | MacLachlan |
| 4,232,636 A | 11/1980 | Prohazka |
| 4,264,705 A | 4/1981 | Allen |
| 4,320,188 A | 3/1982 | Heinz et al. |
| 4,323,637 A | 4/1982 | Chen et al. |

(Continued)

FOREIGN PATENT DOCUMENTS

| | | |
|---|---|---|
| CN | 1985216 | 6/2007 |
| CN | 100407049 | 7/2008 |

(Continued)

OTHER PUBLICATIONS

Lapin, Stephen C., Ph.D., et al., "Effect of Amine Synergists on the EB-Curing Properties of Acrylate-Based Coatings," Radtech Report, Issue 3 (2014) pp. 30-34.

*Primary Examiner* — Chanceity N Robinson

(74) *Attorney, Agent, or Firm* — Carmody Torrance Sandak & Hennessey LLP

(57) ABSTRACT

A photocurable relief image printing blank comprising: (a) a support layer; (b) one or more photocurable layers disposed on the support layer, wherein the one or more photocurable layers comprise: i) a binder; ii) one or more monomers; iii) a photoinitiator; iv) an additive selected from the group consisting of phosphites, phosphines, thioether amine compounds, and combinations of one or more of the foregoing; and v) an additional component comprising amine moieties; (c) a laser ablatable masking layer disposed on the one or more photocurable layers, the laser ablatable masking layer comprising a radiation opaque material; and (d) optionally, a removable coversheet. Upon exposure and development, the resulting relief image printing element does not degrade if left under ambient UV lights for an extended period of time.

13 Claims, 2 Drawing Sheets

(56) References Cited

U.S. PATENT DOCUMENTS

| | | | |
|---|---|---|---|
| 4,369,246 A | 1/1983 | Chen et al. | |
| 4,423,135 A | 12/1983 | Chen et al. | |
| 4,427,759 A | 1/1984 | Gruetzmacher et al. | |
| 4,622,088 A | 11/1986 | Min | |
| 5,135,827 A | 8/1992 | Bohm et al. | |
| 5,223,375 A | 6/1993 | Berrier et al. | |
| 5,260,149 A * | 11/1993 | Monroe | G03F 7/027 359/3 |
| 5,262,275 A | 11/1993 | Fan | |
| 5,541,038 A * | 7/1996 | Ohta | G03F 7/031 430/281.1 |
| 5,925,500 A | 7/1999 | Yang et al. | |
| 6,238,837 B1 | 5/2001 | Fan | |
| 6,326,127 B1 | 12/2001 | Morren et al. | |
| 6,355,395 B1 | 3/2002 | Zewz et al. | |
| 6,413,699 B1 | 7/2002 | Kanga | |
| 8,158,331 B2 | 4/2012 | Recchia | |
| 8,338,499 B2 | 12/2012 | Loccufier et al. | |
| 8,808,968 B2 * | 8/2014 | Choi | G03F 7/09 430/270.1 |
| 2003/0170574 A1 * | 9/2003 | Rieger | G03C 1/795 430/523 |
| 2007/0298351 A1 * | 12/2007 | Shimada | B41C 1/1016 430/281.1 |
| 2009/0043138 A1 | 2/2009 | Rao et al. | |
| 2011/0079158 A1 | 4/2011 | Recchia et al. | |
| 2013/0196144 A1 * | 8/2013 | Roberts | C08L 9/00 428/327 |
| 2013/0228086 A1 * | 9/2013 | Baldwin | B41C 1/05 101/401.1 |
| 2014/0322649 A1 | 10/2014 | Choi et al. | |
| 2015/0252202 A1 | 9/2015 | Nerad | |
| 2016/0207342 A1 | 7/2016 | Choi et al. | |

FOREIGN PATENT DOCUMENTS

| | | |
|---|---|---|
| CN | 104582922 | 4/2015 |
| EP | 0456336 | 11/1991 |
| EP | 0634695 A1 | 1/1995 |
| EP | 0640878 | 3/1995 |
| GB | 1366769 | 9/1974 |
| JP | 2009191179 | 8/2009 |
| TW | 247297 | 5/1995 |
| WO | 2006/019450 A2 | 2/2006 |
| WO | 2014/031329 A1 | 2/2014 |

* cited by examiner

METHOD OF IMPROVING LIGHT STABILITY OF FLEXOGRAPHIC PRINTING PLATES FEATURING FLAT TOP DOTS

FIELD OF THE INVENTION

The present invention relates generally to a digital relief image printing elements having improved storage stability.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of, in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate.

The photocurable layer(s) can include any of the known polymers, monomers, initiators, reactive and/or non-reactive diluents, fillers, and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

Photocurable materials generally cross-link (cure) and harden through radical polymerization in at least some actinic wavelength region. As used herein, "actinic radiation" refers to radiation that is capable of polymerizing, crosslinking or curing the photocurable layer. Actinic radiation includes, for example, amplified (e.g., laser) and non-amplified light, particularly in the ultraviolet (UV) and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming relief image printing elements typically include the following:
1) Image generation, which may be mask ablation for digital "computer to plate" printing plates or negative production for conventional analog plates;
2) Back exposure to create a floor layer in the photocurable layer and establish the depth of relief;
3) Face exposure through the mask (or negative) to selectively crosslink and cure portions of the photocurable layer not covered by the mask, thereby creating the relief image;
4) Development to remove unexposed photopolymer by solvent (including water) or thermal development; and
5) If necessary, post exposure and detackification.

Removable coversheets are also preferably provided to protect the photocurable printing element from damage during transport and handling. Prior to processing the printing elements, the coversheet is removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or alternatively, thermal development) removes the unexposed areas of the photopolymerizable layer, leaving behind a printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Following the brief back exposure step (i.e., brief as compared to the imagewise exposure step which follows), an imagewise exposure is performed utilizing a digitally-imaged mask or a photographic negative mask, which is in contact with the photocurable layer and through which actinic radiation is directed.

The type of radiation used is dependent on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step, including, for example, carbon arcs, mercury-vapor arcs, fluorescent lamps, electron flash units, electron beam units, LEDs and photographic flood lamps.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or thermal development, which typically uses heat plus a blotting material. The resulting surface has a relief pattern, which typically comprises a plurality of dots that reproduces the image to be printed. After the relief image is developed, the resulting relief image printing element may be mounted on a press and printing commenced. In addition, if necessary, after the development step, the relief image printing element may be post exposed and/or detackified as is generally well known in the art.

The shape of the dots and the depth of the relief, among other factors, affect the quality of the printed image. It is also very difficult to print small graphic elements such as fine dots, lines and even text using flexographic printing plates, while at the same time maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Bullet shaped round top dots (RTDs) are created in conventional digital plates, and are attributed to oxygen inhibition taking place on the surface layer during the imaging process. It has been demonstrated that flat top dots (FTDs) are superior to RTDs in printing performance. However, in order to obtain FTDs, oxygen inhibition in the surface layer must be suppressed.

In addition, maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (i.e., the dot is not "held" on plate and/or on press). Alternatively, if the dots survive processing they are susceptible to damage on press. For example small dots can fold over and/or partially break off during printing, causing either excess ink or no ink to be transferred.

As described in U.S. Pat. No. 8,158,331 to Recchia and U.S. Pat. Pub. No. 2011/0079158 to Recchia et al., the subject matter of each of which is herein incorporated by reference in its entirety, a particular set of geometric characteristics can define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

In order to improve surface cure, it has also generally been found that it is beneficial to perform additional procedures and/or use additional equipment, including: (1) laminating a membrane onto the surface of the photopolymer; (2) purging oxygen from the photopolymer using an inert gas; and/or (3) imaging the photopolymer with a high intensity UV source.

Purging oxygen from the photopolymer using an inert gas typically involves placing the photocurable resin plate in an atmosphere of inert gas, such as carbon dioxide gas or nitrogen gas, before exposure, in order to displace the environmental oxygen. A noted drawback to this method is that it is inconvenient and cumbersome and requires a large space for the apparatus.

Another approach involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is typically applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. However, the pre-sensitization step can also cause shadow tones to fill in, thereby reducing the tonal range of the halftones in the image. In the alternative, a selective preliminary exposure, as discussed for example in U.S. Patent Publication No. 2009/0043138 to Roberts et al., the subject matter of which is herein incorporated by reference in its entirety, has also been proposed.

Other efforts to reduce the effects of oxygen on the photopolymerization process have been directed to the use of special plate formulations alone or in combination with the bump exposure. For example, flexographic printing plates have been developed to inherently render FTDs without resorting to the above mentioned methods. These inherent HD plates greatly streamline plate-making procedures and save costs required to support the additional equipment and techniques as described, for example in U.S. Pat. No. 8,808,968 to Choi et al., the subject matter of which is herein incorporated by reference in its entirety. These photocurable relief image printing elements comprise: an additive selected from the group consisting of phosphites, phosphines, thioether amine compounds, and combinations of one or more of the foregoing in the photocurable layer.

However, fully-processed inherent FTD plates such as those described in U.S. Pat. No. 8,808,968, tend to have light instability due to their unique nature of photoresin chemistries. As a result, these FTD photoresins have a tendency to degrade if left under ambient UV lights (~0.4 µW/cm$^2$) for an extended period of time (i.e., greater than 2 weeks) even in a climate-controlled environment. The degraded photoresins become brittle and lose resilience, which greatly comprises printing performance. If the degradation continues, cracks are created in the bulk photoresin upon stress, as seen in FIG. 1. Therefore, these inherent FTD plates need to be kept covered or stored in a dark environment to prevent ambient UV light from degrading the plates.

Thus, it would be desirable to provide an improved photocurable composition for use as fully processed inherent FTD plates and that exhibits good light stability and does not degrade, even after being stored for an extended period of time.

SUMMARY OF THE INVENTION

It is an object of the present invention to provide a relief image printing element having improved surface cure.

It is another object of the present invention to provide a method of tailoring or modifying the shape of relief printing dots in a relief image printing element for optimal printing on various substrates and/or under various conditions.

It is still another object of the present invention to provide an improved method of producing relief image printing elements comprising dots having desirable geometric characteristics.

It is still another object of the present invention to streamline the workflow of a digital platemaking process.

It is still another object of the present invention to provide an improved method of creating a relief image printing element having tailored relief dots in terms of edge definition, should angle and/or print surface.

It is still another object of the present invention to provide a photocurable composition for use as a fully processed inherent FTD plate.

It is still another object of the present invention to provide a photocurable composition that exhibits good light stability.

It is yet another object of the present invention to provide a photocurable composition that does not degrade, even after being stored for an extended period of time.

To that end, in one embodiment, the present invention relates generally to a photocurable relief image printing element comprising:
  a) a support layer;
  b) one or more photocurable layers disposed on the support layer, wherein the one or more photocurable layers comprise:
    i) a binder;
    ii) one or more monomers;
    iii) a photoinitiator;
    iv) an additive selected from the group consisting of phosphites, phosphines, thioether amine compounds, and combinations of one or more of the foregoing; and
    v) an additional component comprising amine moieties;
  c) a laser ablatable masking layer disposed on the one or more photocurable layers, the laser ablatable masking layer comprising a radiation opaque material; and
  d) optionally, a removable coversheet.

DETAILED DESCRIPTION OF THE PREFERRED EMBODIMENTS

Figure 1:
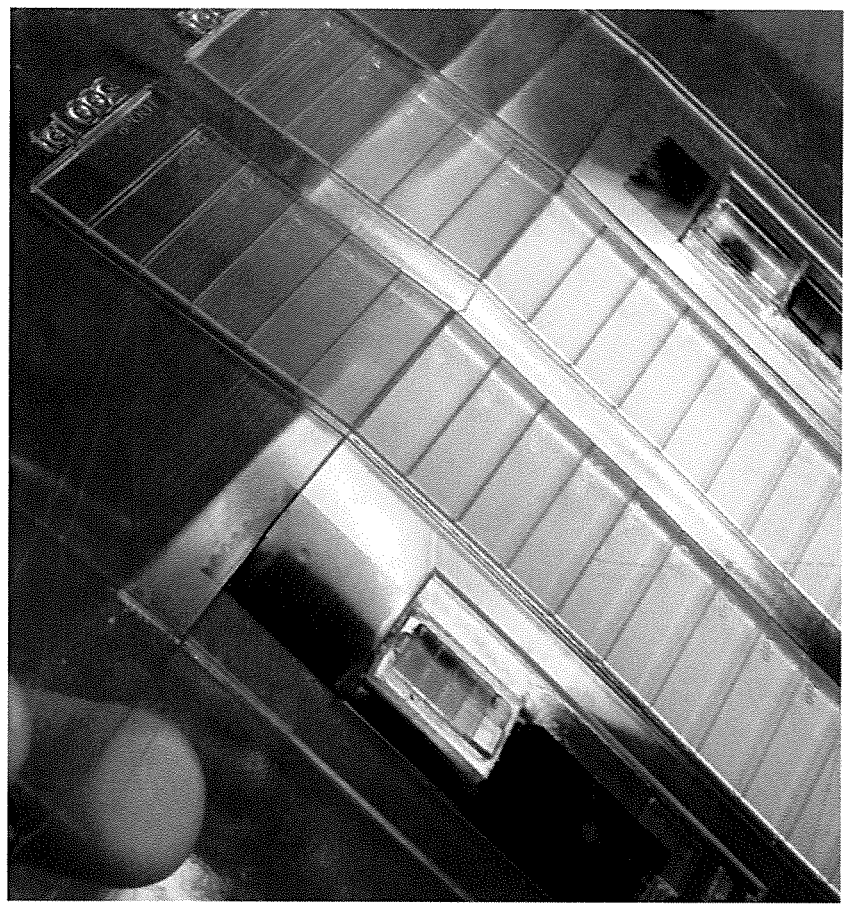
FIG. 1 depicts cracks induced by ambient lights in an inherent FTD plate.

The present invention is directed to an improved photocurable composition that improves light stability of fully-processed inherent FTD photoresins without resorting to conventional antioxidants that tend to compromise imaging features. The benefit of the improved photocurable composition of the present invention is comparable plate-handling and storage characteristics of inherent FTD plates to those of conventional plate formulations without compromising the technical superiority of the inherent FTD photoresins.

Due to the unique nature of the inherent FTD photoresins, fully processed plates tend to exhibit poor light stability. As a result, the inherent FTD plates typically require stricter plate-handling protocols for storage in order to fully realize the technical benefits of inherent FTD plates. The inventors of the present invention have discovered that the use of a component comprising amine moieties in the photocurable composition can improve light stability of the plate without deteriorating imaging features of inherent FTD photoresins.

As described herein, the purpose of the present invention is to improve light stability of fully-processed inherent FTD plates without resorting to conventional antioxidants that tend to compromise distinct imaging features of inherent FTD resins such as 1:1 reproduction (dot size on file≈dot size on plate) and well-defined flat top dots. The present invention relates generally to an improved photopolymer composition that contains an additional component containing amine entities in various materials, such as photoinitiators, HALs, metals salts, amine acrylates, and amines.

In one embodiment, the present invention relates generally to a photocurable relief image printing element comprising:
  a) a support layer;
  b) one or more photocurable layers disposed on the support layer, wherein the one or more photocurable layers comprise:
    i) a binder;
    ii) one or more monomers;
    iii) a photoinitiator;
    iv) an additive selected from the group consisting of phosphites, phosphines, thioether amine compounds, and combinations of one or more of the foregoing; and
    v) an additional component comprising amine moieties;
  c) a laser ablatable masking layer disposed on the one or more photocurable layers, the laser ablatable masking layer comprising a radiation opaque material; and
  d) optionally, a removable coversheet.

The photopolymerizable composition generally comprises one or more binders, monomers and plasticizers in combination with one or more photo-initiators and the above-described additives.

The binder type is not critical to the photopolymer composition and most, if not all, styrenic copolymer rubbers are usable in the compositions of the invention. Suitable binders include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers of the binders. It is generally preferred that the binder be present in at least an amount of 60% by weight of the photosensitive layer. The term binder, as used herein, also encompasses core shell microgels or blends of microgels and pre-formed macromolecular polymers.

Non-limiting examples of binders that are usable in the compositions of the instant invention include styrene isoprene styrene (SIS), a commercial product of which is available from Kraton Polymers, LLC under the tradename Kraton® D1161; styrene isoprene butadiene styrene (SIBS), a commercial product of which is available from Kraton Polymers, LLC under the tradename Kraton® D1171; and styrene butadiene styrene (SBS), a commercial product of which is available from Kraton Polymers LLC under the tradename Kraton® DX405.

Monomers suitable for use in the present invention are addition-polymerizable ethylenically unsaturated compounds. The photocurable composition may contain a single monomer or a mixture of monomers which form compatible mixtures with the binder(s) to produce clear (i.e., non-cloudy) photosensitive layers. The monomers are typically reactive monomers especially acrylates and methacrylates. Such reactive monomers include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-imethylolpropane tetraacrylate, triacrylate of tris(hydroxyethyl)isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate. 1,4-butanediol diacrylate, diethylene glycol dimethacrylate, pentaerythritol tetramethacrylate, glycerin dimethacrylate, trimethylolpropane di methacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates including, for example, cyclohexyl acrylate, isobornyl acrylate, lauryl acrylate and tetrahydrofurfuryl acrylate and the corresponding methacrylates are also usable in the practice of the invention. Especially preferred acrylate monomers include hexanediol diacrylate (HDDA) and trimethylolpropane triacrylate (TMPTA). Especially preferred methacrylate monomers include hexanediol dimethacrylate (HDDMA) and triemethylolpropane trimethacrylate (TMPTA). It is generally preferred that the one or more monomers be present in at least an amount of 5% by weight of the photosensitive layer.

The photopolymer layer also optionally, but preferably, contains a compatible plasticizer, which serves to lower the glass transition temperature of the binder and facilitate selective development. Suitable plasticizers include, but are not limited to, dialkyl phthalates, alkyl phosphates, polyethylene glycol, polyethylene glycol esters, polyethylene glycol ethers, polybutadiene, polybutadiene styrene copolymers, hydrogenated, heavy naphthenic oils, hydrogenated, heavy paraffinic oils, and polyisoprenes. Other useful plasticizers include oleic acid, lauric acid, etc. If used, the plasticizer is generally present in an amount of at least 10% by weight, based on weight of total solids of the photopolymer composition. Commercially available plasticizers for use in compositions of the invention include 1,2-polybutadiene, available from Nippon Soda Co. under the tradename Nisso PB B-1000; Ricon 183, which is a polybutadiene styrene copolymer, available from Cray Valley; Nyflex 222B, which is a hydrogenated heavy naphthenic oil, available from Nynas AB; ParaLux 2401, which is a hydrogenated heavy paraffinic oil, available from Chevron U.S.A., Inc.; and Isolene 40-S, which is a polyisoprene available from Royal Elastomers.

Photoinitiators for the photocurable composition include benzoin alkyl ethers, such as benzoin methyl ether, benzoin ethyl ether, benzoin isopropyl ether and benzoin isobutyl ether. Another class of photoinitiators are the dialkoxyacetophenones such as 2,2-dimethoxy-2-phenylacetophenone and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenyl-butyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetopherione, benzaldehyde, alpha-tetralone, 9-acetylphenarithrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4.degree.-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-otolylphosphine can also be used as photoinitiators.

Preferred photoinitiators for use in the photopolymer compositions of the invention include 2,2-dimethoxy-2-phenylacetophenone, a commercial product of which is available from BASF under the Tradename Irgacure® 651; α-hydroxyketone, a commercial product of which is available from BASF under the tradename Irgacure® 184; and acyl phosphine, a commercial product of which is available from Ciba Specialty Chemicals under the tradename Darocur® TPO. In one embodiment, it was determined that Irgacure® 651 was the most effective photoinitiator for UV light with the wavelength of ~365 nm to obtain the benefits described herein. However, other photoinitiators can also be used, alone or in combination with Irgacure® 651.

As described herein, the additives may comprise phosphites, having the general structure $P(OR)_3$ or $P(OAr)_3$, phosphines, having the general structure $PR_3$ or $PAr_3$, thio-ether amine compounds, or combinations of one or more of the foregoing. The additive(s) may be used in the photopolymer composition in an amount of about 0.1 to about 10% by weight, more preferably in an amount of about 0.05 to about 2% by weight.

Suitable phosphites include, but are not limited to, tris (nonylphenyl)phosphite (TNPP) (CAS No. 26523-78-4), triphenyl phosphite, diphenyl phosphite, tridecyl phosphite, triisodecyl phosphite, tris(tridecyl)phosphite, trilauryl phosphite, disteraryl pentaerythriol diphosphite, diisodecyl phenyl phosphite, diphenyl isodecyl phosphite, diphenyl octyl phosphite, diphenyl isooctyl phosphite, diphenyl tri isodecyl monophenyl dipropyleneglycol diphosphite, alkyl bisphenol A phosphite, tetraphenyl dipropyleneglycol diphosphite, poly(dipropyleneglycol) phenyl phosphite, tris(dipropylene glycol) phosphite, and dioleyl hydrogen phosphate. In one embodiment, the phosphite comprises TNPP.

Suitable phosphines include, but are not limited to, triphenyl phosphine, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, divinyl-p-bromophenylphosphine, and diallyl-p-tolylphosphine.

Suitable thioether amine compounds include, but are not limited to, 2,6-di-tert-butyl-4-(4,6-bis(octylthio)-1,3,5-triazin-2-ylamino)phenol (CAS No. 991-84-4), 4-[[4,6-bis(nonylsulfanyl)-1,3,5-triazin-2-yl]amino]-2,6-ditert-butylphenol, 4-[[4,6-bis(octadecylsulfanyl)-1,3,5-triazin-2-yl]amino]-2,6-ditert-butylphenol, 4-[[4,6-octylsulfanyl)-1,3,5-triazin-2-yl]amino]-2,6-bis(2-methylnonan-2-yl)phenol, 4-[[4,6-bis(hexylsulfanyl)-1,3,5-triazin-2-yl]amino]-2,6-di-tert-butylphenol, 4-[[4,6-bis(heptylsulfanyl)-1,3,5-triazin-2-yl]amino]-2,6-ditert-butylphenol, 4-[[4,6-bis(octylsulfanyl)-1,3,5-triazin-2-y]amino]-2-tert-butyl-6-methylphenol, [4,6-bis(ethylsulfanyl)-1,3,5-triazin-2-yl]amino]-2,6-ditert-butylphenol, 4-[[4,6-bis(2,4,4-trimethylpentan-2-ylsulfanyl)-1,3,5-triazin-2-yl]amino]-2,6-ditert-butylphenol, 4-[[4,6-bis(2-octylsulfanylethylsulfanyl)-1,3,5-triazin-2-yl]amino]-2,6-ditert-butylphenol, 4-[[4,6-bis(octylsulfanyl)-1,3,5-triazin-2-yl]amino]-2,6-dibutylphenol, [[4,6-bis(octylsulfanyl)-1,3,5-triazin-2-yl]amino]-2,6-dimethylphenol, 2,6-ditert-butyl-4-[[4-(3,5-ditert-butyl-4-hydroxyanilino)-6-octylsulfany-1-1,3,5-triazin-2-yl]amino]phenol, 4-[[4,6-bis(pentylsulfanyl)-1,3,5-triazin-2-yl]amino-2,6-dimethylphenol, 4-[[4,6-bis(hexylsulfanyl)-1,3,5-triazin-2-yl]amino]-2-tert-butylphenol, 2,6-ditert-butyl-4-[(4-octylsulfanyl-1,3,5-triazin-2-yl)amino]phenol, 4-[[4,6-bis(ethylsulfanyl)-1,3,5-triazin-2-yl]amino]-2,6-dimethylphenol, 4-[[4,6-bis(octylsulfanyl)-1,3,5-triazin-2-yl]-butylamino]-2,6-ditert-butylphenol, 4-[[4,6-bis(octylsulfanyl)-1,3,5-triazin-2-yl]-cyclohexylamino]-2,6-ditert-butylphenol, 4-[[4,6-bis(octylsulfanyl)-1,3,5-triazin-2-yl]amino]-6-tert-butylphenol, 2-tert-butyl-6-methyl-4-[[4-octylsulfanyl-6-[(2,2,6,6,-tetramethylpiperid-in-4-yl) amino]-1,3,5-triazin-2-yl]amino]phenol, 4-[[4,6-bis(octylsulfanylmethyl)-1,3,5-triazin-2-y]amino]-2,6-ditert-butylphenol, 4-[[4,6-bis(octylsulfanyl)-1,3,5-triazin-2-yl)methylamino]-2,6-di-tert-butylphenol, 4-[(4-amino-6-chloro-1,3,5-triazin-2-yl)amino]-2,6-ditert-butylphenol, and 4-[(4-cyclohexyl-6-cyclohexylsulfanyl-1,3,5-triazin-2-yl) amino]-2,6-d-i(propan-2-yl)phenol. In one embodiment, the thioether amine compound comprises 2,6-di-tert-butyl-4-(4, 6-bis(octylthio)-1,3,5-triazin-2-ylamino)phenol (also referred to as phenol, 4-[[4,6-bis(octylthio)-1,3,5-triazin-2-yl]amino]-2,6-bis(1,1-dimethylethyl).

Various dyes and/or colorants may also optionally be used in the practice of the invention although the inclusion of a dye and/or colorant is not necessary to attain the benefits of the present invention. Suitable colorants are designated "window dyes" which do not absorb actinic radiation in the region of the spectrum that the initiator present in the composition is activatable. The colorants include, for example, CI 109 Red dye, Methylene Violet (CI Basic Violet 5), "Luxol." Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red I or CI 45160), 1,1'-diethyl-2,2'-cyanine iodide, Fuchsine dye (CI 42510), Calcocid Green S (CI 44090), Anthraquinone Blue 2 GA (CI Acid Blue 58), Solvaperm Red BB (Solvent Red 195), etc. The dyes and/or colorants must not interfere with the imagewise exposure.

Other additives including antiozonants, fillers or reinforcing agents, thermal polymerization inhibitors, UV absorbers, etc. may also be included in the photopolymerizable composition, depending on the final properties desired. Such additives are generally well known in the art. However, care must be taken to ensure that the use of these other additives do not compromise imaging properties of the photopolymerizable composition.

Suitable fillers and/or reinforcing agents include immiscible, polymeric or nonpolymeric organic or inorganic fillers or reinforcing agents which are essentially transparent at the wavelengths used for exposure of the photopolymer material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

Thermal polymerization inhibitors include, for example, p-methoxyphenol, hydroquinone, and alkyl and aryl-substituted hydroquinones and quinones, tert-butyl catechol, pyrogallol, copper resinate, naphthalamines, beta-naphthol, cuprous chloride, 2,6-di-tert-butyl-p-cresol, butylated hydroxytoluene (BHT), oxalic acid, phenothiazine, pyridine, nitrobenzene and dinitrobenzene, p-toluquinone and chloranil. While in some instances it may be desirable to include a thermal polymerization inhibitor such as BHT or similar thermal polymerization inhibitors in the photopolymerizable composition, care must be taken to use BHT and other similar thermal polymerization inhibitors only in an amount and with a combination of other additives such that it does not comprise the imaging properties of the photopolymerizable resin, especially after being stored for an extended period of time. Thus, in some instances, it is desirable that the photopolymerizable composition does not contain any BHT and therefore is free of, or essentially free of BHT and other similar thermal polymerization inhibitors. In other instances, and depending on the particular additional component containing amine moieties being added, the photopolymerizable composition contains less than about 0.5 percent by weight, more preferably less than 0.1 percent by weight of BHT or similar thermal polymerization inhibitor.

As described herein, in order to improve the storage stability of the photopolymerizable resin, the photopolymerizable resin described herein also contains one or more additional components comprising amine moieties or amine synergists. These one or more additional components containing amine moieties or amine synergists may be selected from various materials that include amine moieties, including for example, photoinitiators containing amine moieties, hindered amine light stabilizers (HALS), thermal polymerization inhibitors, amine acrylates, amine reaction accelerators, and combinations of one or more of the foregoing. These one or more additional components comprising amine moieties are used in the photopolymerizable composition at a concentration of between about 0.1 to about 10 percent by weight, more preferably about 0.2 to about 5.0 percent by weight, based on the total weight of the composition.

Suitable photoinitiators that contain amine moieties include aminoacetophenone initiators, commercial products of which are available from BASF under the tradenames IRGACURE® 907, IRGACURE® 369, and Irgacure® 379. Other aminoacetophenone initiators that can be used include the compounds described in JP2009-191179 to Toyo Ink Manufacturing. One preferred photoinitiator is 2-dimethyl-amine-2-(4-methyl-benzyl)-1-(4-morpholin-4-yl-phenyl)-butan-1-one (CAS #: 119344-86-4), available from BASF, under the tradename Irgacure® 379.

Suitable hindered amine light stabilizers (HALS) include, for example, materials that contain 2,2,6,6-tetrametyl-4- piperidyl groups, including materials such as those described in U.S. Pat. Pub. No. 20150252202 to Nerad, the subject matter of which is herein incorporated by reference in its entirety. Preferred materials that contain 2,2,6,6-tetrametyl-4-piperidyl groups include, for example, bis(2,2,6,6-tetramethyl-4-piperidinyl)sebacate (CAS #: 52829-07-9), a commercial product of which is available from BASF, under the tradename Tinuvin 770 and from Mayzo, Inc. under the tradename BLS 1770, as well as other derivatives of 2,2,6,6-tetramethylpiperidine and derivatives of 1,2,2,6,6-pentamethylpiperidine; dimethyl succinate polymer with 4-hydroxy-2,2,6,6-tetramethyl-1-piperidine ethanol (CAS #: 65447-77-0), available from Mayzo, Inc., under the tradename BLS 1622; poly[[6-[(1,1,3,3,-tetramethylbutyl)amino-s-triazine-2,4-diyl][2,2,6,6-tetramethyl-4-piperidyl)imino]] hexamethyl-ylene[(2,2,6,6-tetramethyl-4-piperidyl)imino]] (CAS #: 70624-18-9), available from Mayzo, Inc. under the tradename BLS 1944; and N,N',N'',N'''-tetrakis(4,6-bis(butyl-(N-methyl-2,2,6,6-tetramethylpiperidin-4-yl) amino)tri-azin-2-yl)-4,7-diazadecane-1,10-diamine (CAS #: 106990-43-6), available from Mayzo, Inc. under the tradename BLS 119.

Suitable thermal polymerization inhibitors containing amine moieties include aluminum N-nitroso-N-phenylhydroxylamine (CAS #: 15305-07-4), available from Shanghai Boer Chemical Reagent Co., Ltd. under the tradenamne BR510 and from Wako Pure Chemical Industries and a liquid blend of aluminum N-nitrosophenylhydroxylamine (CAS #15305-07-4) and di-trimethylol-propane tetraacrylate (CAS #94108-97-1), available from IGM Resins under the tradename Omnistab IN 522.

Suitable amine acrylates include, for example, hexane-1,6-diyl bisprop-2-enoate-2-aminoethanol (CAS #: 67906-98-3), commercials products of which are available from IGM Resins under the tradenames Photomer 4771 and Photomer 4775; and 2-Propenoic acid, (1-methyl-1,2-ethanediyl) bisoxy(methyl-2,1-ethanediyl) ester reaction products with diethylamine (CAS #: 111497-86-0), a commercial product of which is available from IGM Resins under the tradename Photomer 4967.

Suitable amine reaction accelerators, include primary, secondary and tertiary aliphatic, aromatic, aliphatic or heterocyclic amines. Examples of these amines include butylamine, dibutylamine, tributylamine, cyclohexyl amine, benzyldiniethylamine, dicyclohexylamine, triethanolamine, N-methyldiethanolamine, phenyldiethanolamine, piperidine, piperazine, morpholine, pyridine, quinoline, ethyl p-dimethylaminobenzoate, butyl p-dimethylamino benzoate, 4,4'-bis(dimethylamino)-benzophenone (Michler's ketone) and 4,4'-bis(diethylamino)-benzophenone. Particularly preferred amine reaction accelerators include dibutylamine and triethanolamine.

In another embodiment, the present invention relates generally to a method of producing a relief image printing element from a photocurable printing blank, the method comprising the steps of:
a) providing a photocurable printing blank, the photocurable printing blank comprising:
 i) a backing or support layer;
 ii) one or more photocurable layers disposed on the backing or support layer, wherein the one or more photocurable layers comprise:
  1) a binder;
  2) one or more monomers;
  3) a photoinitiator;
  4) an additive selected from the group consisting of phosphites, phosphines, thioether amine compounds, and combinations of one or more of the foregoing; and
  5) an additional component comprising amine moieties;
 iii) a laser ablatable masking layer disposed on the at least one photocurable layer, the laser ablatable masking layer comprising a radiation opaque material;
b) selectively ablating the laser ablatable mask laser to create an in situ negative of a desired image in the laser ablatable mask layer;
c) exposing the at least one photocurable layer to actinic radiation through the in situ negative to selectively crosslink and cure portions of the at least one photocurable layer; and
d) developing the exposed at least one photocurable layer of the photocurable printing blank to reveal the relief image therein, said relief image comprising a plurality of relief printing dots.

The photocurable compositions can be developed using a solvent to dissolve away the uncured and uncrosslinked portions of the photocurable composition or developed using thermal development in which the uncured and uncrosslinked portions were softened and/or melted and then blotted away. Other means of developing the photocurable composition are also known to those skilled in the art.

The resulting photocured relief image printing element preferably has a Shore A hardness of between about 45 and about 70, more preferably between about 50 and about 65.

Tables 1 and 2 summarize various examples of various formulae of photocurable compositions prepared in accordance with the present invention. These photocurable compositions were imagewise exposed to actinic radiation and developed to reveal the relief image therein comprising a plurality of relief printing dots. The resulting photocured compositions comprising the plurality of relief printing dots were then examined.

TABLE 1

Various formulae prepared in accordance with the present invention (% by wt.)

| Component | Ex. 1 | Ex. 2 | Ex. 3 | Ex. 4 | Ex. 5 | Ex. 6 | Ex. 7 |
|---|---|---|---|---|---|---|---|
| Binder | 64.39 | 64.39 | 63.89 | 64.59 | 64.39 | 64.39 | 64.39 |
| Plasticizer | 19.86 | 19.86 | 19.86 | 19.86 | 19.36 | 19.36 | 19.36 |
| Methacrylate monomer | 8.95 | 8.95 | 8.95 | 8.95 | 8.95 | 8.95 | 8.95 |
| Irgacure ® 651 | 5 | 5 | 5 | 3 | 5 | 5 | 5 |
| TNPP | 1.8 | 1.3 | 1.8 | 0.57 | 1.8 | 1.8 | 1.8 |
| Solvaperm Red BB | 0.0025 | 0.0025 | 0.0025 | 0.0025 | 0.0025 | 0.0025 | 0.0025 |
| TPP | | | | 0.93 | | | |

TABLE 1-continued

Various formulae prepared in accordance with the present invention (% by wt.)

| Component | Ex. 1 | Ex. 2 | Ex. 3 | Ex. 4 | Ex. 5 | Ex. 6 | Ex. 7 |
|---|---|---|---|---|---|---|---|
| BHT | | | 0.50 | 0.10 | | | |
| Tinuvin 770 | | 0.50 | | | | | |
| Irgacure 379 | | | | 2.0 | | | |
| 520 | | | | | 0.5 | | |
| NPAL | | | | | | 0.5 | |
| BLS 119 | | | | | | | 0.5 |
| Total | 100 | 100 | 100 | 100 | 100 | 100 | 100 |
| Light Stability | 5 | 1 | 1 | 1 | 3 | 3 | 4 |
| Holding dots at 1%-200 lpi? | Yes | Yes | No | Yes | Yes | Yes | Yes |

TABLE 2

Various formulae prepared in accordance with the present invention (% by wt.)

| Component | Ex. 8 | Ex. 9 | Ex. 10 | Ex. 11 | Ex. 12 | Ex. 13 | Ex. 14 |
|---|---|---|---|---|---|---|---|
| Binder | 64.39 | 64.39 | 64.39 | 64.39 | 64.39 | 64.39 | 64.39 |
| Plasticizer | 19.36 | 19.36 | 16.39 | 16.39 | 16.39 | 19.36 | 19.36 |
| Methacrylate monomer | 8.95 | 8.95 | 8.95 | 8.95 | 8.95 | 8.95 | 8.95 |
| Irgacure ® 651 | 5 | 5 | 5 | 5 | 5 | 5 | 5 |
| TNPP | 1.8 | 1.8 | 1.8 | 1.8 | 1.8 | 1.8 | 1.8 |
| Solvaperm Red BB | 0.0025 | 0.0025 | 0.0025 | 0.0025 | 0.0025 | 0.0025 | 0.0025 |
| BLS 1622 | 0.5 | | | | | | |
| BLS 1944 | | 0.5 | | | | | |
| Photomer 4771 | | | 3.0 | | | | |
| Photomer 4775 | | | | 3.0 | | | |
| Photomer 4967 | | | | | 3.0 | | |
| Dibutylamine | | | | | | 0.5 | |
| Triethanolamine | | | | | | | 0.5 |
| Total | 100 | 100 | 100 | 100 | 100 | 100 | 100 |
| Light Stability | 4 | 4 | 4 | 4 | 3 | | |
| Holding dots at 1%-200 lpi? | Yes | Yes | Yes | Yes | Yes | | |

The holding dots at 1%-200 lpi was determined by reviewing SEM pictures of each Example.

Light stability of each formulation was determined by expediting light exposure testing at 12 µW/cm² for seven days. The light stability was quantified on a scale of 1 to 5, with 1 being the best and 5 being the worst.

Figure 2:
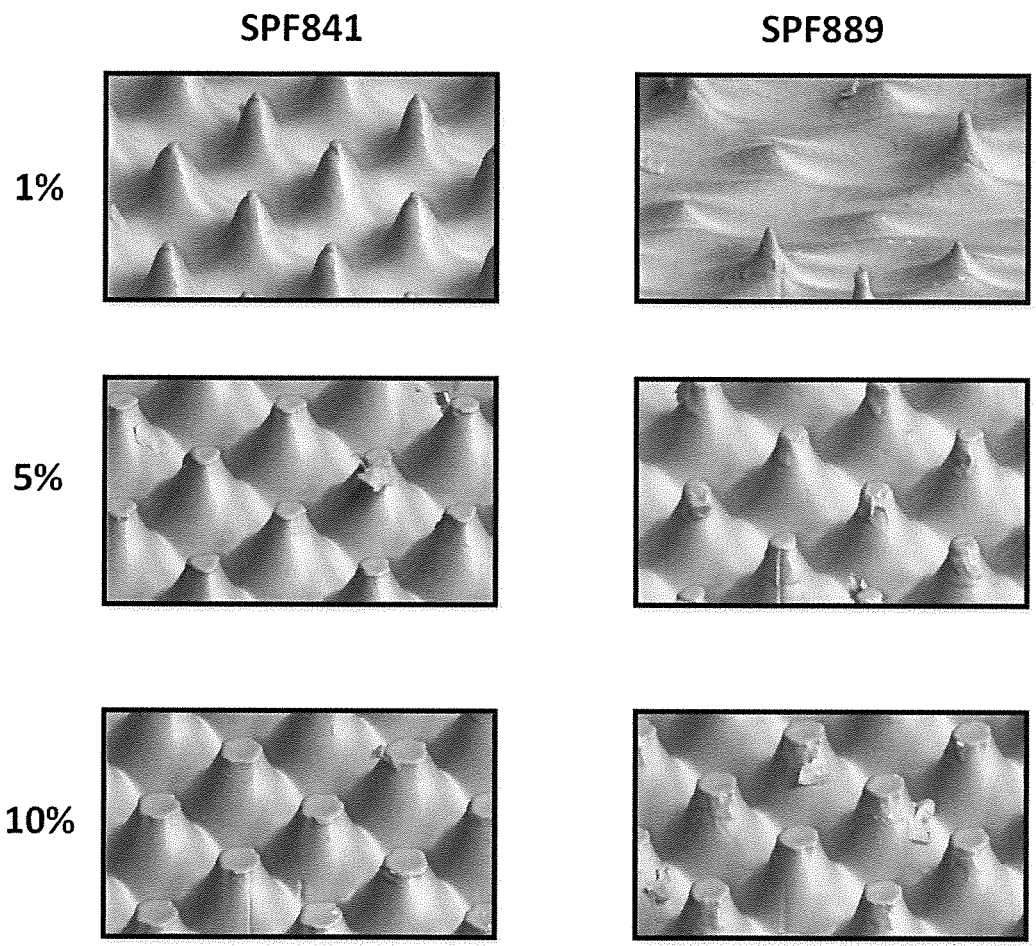
FIG. 2 depicts SEM pictures of 200 lpi dots in two different plate formulations.

Example 1 is a Comparative Example which contains a phosphite additive but that does not contain an additional component containing amine moieties. As seen in Table 1, while this Example does hold 1% dots at 200 lpi, the light stability is very poor, as seen in FIG. 2, as formulation SPF841.

Example 3 is another Comparative Example which contains BHT as a thermal polymerization inhibitor. As seen in Table 1, while the light stability is good in this example, the composition was not capable of holding 1% dots at 200 lpi, as seen in FIG. 2 as formulation SPF889.

Example 4 describes a composition in which 0.1 percent by weight of BHT was added for thermal stability during extrusion of the photocurable composition in combination with Irgacure® 379 as the additional component containing amine moieties. As seen from this Example, both the light stability and the ability to hold 1% dots at 200 lpi were good.

The results show that the light stability of the photocurable composition can be improved by the addition of a component containing amine moieties to the composition.

As described in U.S. Pat. No. 8,808,968, the improved surface cure in the relief image printing elements can be revealed by the shape of the dots, and it is desirable that the dot shape exhibit a flat top.

The planarity of the top of a dot can be measured as the radius of curvature across the top surface of the dot, $r_e$. It is noted that a rounded dot surface is not ideal from a printing perspective because the size of the contact patch between the print surface and the dot varies exponentially with impression force. Therefore, the top of the dot preferably has a planarity where the radius of curvature of the dot top is greater than the thickness of the photopolymer layer, more preferably twice the thickness of the photopolymer layer, and most preferably more than three times the total thickness of the photopolymer layer.

Edge sharpness relates to the presence of a well-defined boundary between the planar dot top and the shoulder and it is generally preferred that the dot edges be sharp and defined. These well-defined dot edges better separate the "printing" portion from the "support" portion of the dot, allowing for a more consistent contact area between the dot and the substrate during printing, Edge sharpness can be defined as the ratio of $r_e$, the radius of curvature (at the intersection of the shoulder and the top of the dot) to p, the width of the dot's top or printing surface. For a truly round-tipped dot, it is difficult to define the exact printing surface because there is not really an edge in the commonly understood sense, and the ratio of $r_e$:p can approach 50%, In contrast, a sharp-edged dot would have a very small value of $r_e$, and $r_e$:p would approach zero. In practice, an $r_e$:p of less than 5% is preferred, with an $r_e$:p of less than 2% being most preferred.

Finally, it should also be understood that the following claims are intended to cover all of the generic and specific features of the invention described herein and all statements of the scope of the invention that as a matter of language might fall there between.

What is claimed is:

1. A flexographic photocurable printing blank comprising:
   a) a support layer;
   b) one or more photocurable layers disposed on the support layer, wherein the one or more photocurable layers comprise:
      i) a binder;
      ii) one or more monomers;
      iii) a photoinitiator;
      iv) an additive selected from the group consisting of phosphites, phosphines, thioether amine compounds, and combinations of one or more of the foregoing; and
      v) an additional component comprising amine moieties, wherein the additional component comprising amine moieties is one or more components selected from the group consisting of hindered amine light stabilizers selected from the group consisting of bis(2,2,6,6-tetramethyl-4-piperidinyl)sebacate, derivatives of 2,2,6,6-tetramethylpiperidine, derivatives of 1,2,2,6,6-pentamethylpiperidine; dimethyl succinate polymer with 4-hydroxy-2,2,6,6-tetramethyl-1-piperidine ethanol, poly[[6-[(1,1,3,3,-tetramethylbutyl)amino-s-triazine-2,4-diyl][2,2,6,6-tetramethyl-4-piperidyl)imino]]hexamethyl-ylene[(2,2,6,6-tetramethyl-4-piperidyl)imino]], N,N',N'',N'''-tetrakis(4,6-bis(butyl-(N-methyl-2,2,6,6-tetramethylpiperidin-4-yl) amino)triazin-2-yl)-4,7-diazadecane-1,10-diamine, and combinations of one or more of the foregoing, amine acrylates, and thermal polymerization inhibitors selected from aluminum N-nitroso-N-phenylhydroxylamine, a liquid blend of aluminum N-nitrosophenylhydroxylamine and di-trimethylol-propane tetraacrylate, and combinations of the foregoing;
   c) a laser ablatable masking layer disposed on the one or more photocurable layers, the laser ablatable masking layer comprising a radiation opaque material; and
   d) optionally, a removable coversheet.

2. The flexographic photocurable printing blank according to claim 1, wherein the additive comprises tris(nonylphenyl)phosphite.

3. The flexographic photocurable printing blank according to claim 1, wherein the additive is a thioether amine compound selected from the group consisting of 2,6-di-tert-butyl-4-(4,6-bis(octylthio)-1,3,5-triazin-2-ylamino)phenol, 4-[[4,6-bis(nonylsulfanyl)-1,3,5-triazin-2-yl] amino]-2,6-di-tert-butylphenol, 4-[[4,6-bis(octadecylsulfanyl)-1,3,5-triazin-2-yl]amino]-2,6-ditert-butylphenol, 4-[[4,6-octylsulfanyl)-1,3,5-triazin-2-yl]amino]-2,6-bis(2-methylnonan-2-yl)phenol, 4-[[4,6-bis(hexyl sulfanyl)-1,3,5-triazin-2-yl]amino]-2,6-ditert-butylphenol, 4-[[4,6-bis(heptylsulfanyl)-1,3,5-triazin-2-yl]amino]-2,6-ditert-butylphenol, 4-[[4,6-bis(octylsulfanyl)-1,3,5-triazin-2-yl]amino]-2-tert-butyl-6-methylphenol, 4-[[4,6-bis(ethylsulfanyl)-1,3,5-triazin-2-yl]amino]-2,6-ditert-butylphenol, 4-[[4,6-bis(2,4,4-trimethylpentan-2-ylsulfanyl)-1,3,5-triazin-2-yl]amino]-2,6-ditert-butylphenol, 4-[[4,6-bis(2-octylsulfanylethylsulfanyl)-1,3,5-triazin-2-yl]amino]-2,6-ditert-butylphenol, 4-[[4,6-bis(octylsulfanyl)-1,3,5-triazin-2-yl]amino]-2,6-dibutylphenol, 4-[[4,6-bis(octylsulfanyl)-1,3,5-triazin-2-yl]amino]-2,6-dimethylphenol, 2,6-ditert-butyl-4-[[4-(3,5-ditert-butyl-4-hydroxyanilino)-6-octylsulfany-1-1,3,5-triazin-2-yl]amino]phenol, 4-[[4,6-bis(pentylsulfanyl)-1,3,5-triazin-2-yl]amino-2,6-dimethylphenol, 4-[[4,6-bis(hexyl sulfanyl)-1,3,5-triazin-2-yl]amino]-2-tert-butylphenol, 2,6-ditert-butyl-4-[(4-octylsulfanyl-1,3,5-triazin-2-yl)amino]phenol, 4-[[4,6-bis(ethylsulfanyl)-1,3,5-triazin-2-yl]amino]-2,6-dimethylphenol, 4-[[4,6-bis(octylsulfanyl)-1,3,5-triazin-2-yl]-butylamino]-2,6-ditert-butylphenol, 4-[[4,6-bis(octylsulfanyl)-1,3,5-triazin-2-yl]-cyclohexylamino]-2,6-ditert-butylphenol, 2-[[4,6-bis(octylsulfanyl)-1,3,5-triazin-2-yl]amino]-6-tert-butylphenol, 2-tert-butyl-6-methyl-4-[[4-octylsulfanyl-6-[(2,2,6,6,-tetramethylpiperidin-4-yl)amino]-1,3,5-triazin-2-yl]amino]phenol, 4-[[4,6-bis(octylsulfanylmethyl)-1,3,5-triazin-2-yl)amino]-2,6-ditert-butylphenol, 4-[[4,6-bis(octylsulfanyl)-1,3,5-triazin-2-yl)methylamino]-2,6-ditert-butylphenol, 4-[(4-amino-6-chloro-1,3,5-triazin-2-yl)amino]-2,6-ditert-butylphenol, and 4-[(4-cyclohexyl-6-cyclohexylsulfanyl-1,3,5-triazin-2-yl)amino]-2,6-di(propan-2-yl)phenol.

4. The flexographic photocurable printing blank according to claim 3, wherein the additive comprises 2,6-di-tert-butyl-4-(4,6-bis(octylthio)-1,3,5-triazin-2-ylamino)phenol.

5. The flexographic photocurable printing blank according to claim 1, wherein the additive is a phosphine selected from the group consisting of triphenyl phosphine, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, divinyl-p-bromophenylphosphine, and diallyl-p-tolylphosphine and combinations of one or more of the foregoing.

6. The flexographic photocurable printing blank according to claim 1, wherein the additional component containing amine moieties comprises the thermal polymerization inhibitor selected from the group consisting of aluminum N-nitroso-N-phenylhydroxylamine, a liquid blend of aluminum N-nitrosophenylhydroxylamine and di-trimethylol-propane tetraacrylate, and combinations of the foregoing.

7. The flexographic photocurable printing blank according to claim 1, wherein the additional component containing amine moieties comprises an amine acrylate selected from the group consisting of hexane-1,6-diyl bisprop-2-enoate-2-aminoethanol, 2-Propenoic acid, (1-methyl-1,2-ethanediyl) bisoxy(methyl-2,1-ethanediyl) ester reaction products with diethylamine, and combinations of the foregoing.

8. The flexographic photocurable printing blank according to claim 1, wherein the additional component containing amine moieties is present in the one or more photocurable layers in an amount of between 0.1 to 10 percent by weight, based on the total weight of the photocurable composition.

9. The flexographic photocurable printing blank according to claim 1, wherein the one or more photocurable layers further comprises one or more materials selected from the group consisting of plasticizers, antiozonants, fillers, reinforcing agents, thermal polymerization inhibitors, UV absorbers and combinations of one or more of the foregoing.

10. The flexographic photocurable printing blank according to claim 1, wherein the one or more photocurable layers does not contain butylated hydroxytoluene, 2,4-Bis(octylthio)-6-(4-hydroxy-3,5-di-tert-butylanilino)-1,3,5-triazine, or 1,3,5-Trimethyl-2,4,6-tris(3,5-di-tert-butyl-4-hydroxybenzyl)benzene.

11. The flexographic photocurable printing blank according to claim 9, wherein the one or more materials comprise a plasticizer.

12. A method of producing a flexographic relief image printing element from a flexographic photocurable printing blank, the method comprising the steps of:
- a) providing a photocurable printing blank, the photocurable printing blank comprising:
  - i) a backing or support layer;
  - ii) one or more photocurable layers disposed on the backing or support layer, wherein the one or more photocurable layers comprise:
    1) a binder;
    2) one or more monomers;
    3) a photoinitiator;
    4) an additive selected from the group consisting of phosphites, phosphines, thioether amine compounds, and combinations of one or more of the foregoing; and
    5) an additional component comprising amine moieties, wherein the additional component comprising amine moieties is one or more components selected from the group consisting of hindered amine light stabilizers selected from the group consisting of bis(2,2,6,6-tetramethyl-4-piperidinyl)sebacate, derivatives of 2,2,6,6-tetramethylpiperidine, derivatives of 1,2,2,6,6-pentamethylpiperidine; dimethyl succinate polymer with 4-hydroxy-2,2,6,6-tetramethyl-1-piperidine ethanol, poly[[6-[1,1,3,3,-tetramethylbutyl)aminostriazine-2,4-diyl][2,2,6,6-tetramethyl-4-piperidyl)imino]]hexamethyl-ylene[(2,2,6,6-tetramethyl-4-piperidyl)imino]], N,N',N'',N'''-tetrakis(4,6-bis(butyl-(N-methyl-2,2,6,6-tetramethylpiperidin-4-yl) amino)triazin-2-yl)-4,7-diazadecane-1,10-diamine, and combinations of one or more of the foregoing, amine acrylates, and thermal polymerization inhibitors selected from aluminum N-nitroso-N-phenylhydroxylamine, a liquid blend of aluminum N-nitrosophenylhydroxylamine and ditrimethylol-propane tetraacrylate, and combinations of the foregoing;
  - iii) a laser ablatable masking layer disposed on the one or more photocurable layers, the laser ablatable masking layer comprising a radiation opaque material;
- b) selectively ablating the laser ablatable mask laser to create an in situ negative of a desired image in the laser ablatable mask layer;
- c) exposing the at least one photocurable layer to actinic radiation through the in situ negative to selectively crosslink and cure portions of the one or more photocurable layers; and
- d) developing the exposed one ox more photocurable layers of the photocurable printing blank to reveal the relief image therein, said relief image comprising a plurality of relief printing dots.

13. The method according to claim 12, wherein the relief image printing element does not degrade if left under ambient UV lights for an extended period of time.

* * * * *